US009007101B2

(12) United States Patent
Zeng

(10) Patent No.: US 9,007,101 B2
(45) Date of Patent: Apr. 14, 2015

(54) DRIVER CIRCUIT FOR DRIVING POWER TRANSISTORS

(71) Applicant: STMicroelectronics (Shenzhen) R&D Co. Ltd., Shenzhen, Nanshan (CN)

(72) Inventor: Ni Zeng, Shenzhen (CN)

(73) Assignee: STMicroelectronics (Shenzhen) R&D Co. Ltd, Shenzhen (CN)

( * ) Notice: Subject to any disclaimer, the term of this patent is extended or adjusted under 35 U.S.C. 154(b) by 0 days.

(21) Appl. No.: 14/073,494

(22) Filed: Nov. 6, 2013

(65) Prior Publication Data

US 2014/0184278 A1    Jul. 3, 2014

(30) Foreign Application Priority Data

Dec. 31, 2012 (CN) .......................... 2012 1 0596228

(51) Int. Cl.
*H03K 3/00* (2006.01)
*H03K 17/00* (2006.01)
*H03K 17/06* (2006.01)

(52) U.S. Cl.
CPC ............... *H03K 17/00* (2013.01); *H03K 17/06* (2013.01); *H03K 2017/066* (2013.01); *H03K 2217/0036* (2013.01); *H03K 2217/0063* (2013.01)

(58) Field of Classification Search
USPC ......................................................... 327/109
See application file for complete search history.

(56) References Cited

U.S. PATENT DOCUMENTS

| | | | | |
|---|---|---|---|---|
| 5,500,610 A | * | 3/1996 | Burstein | 326/85 |
| 5,594,703 A | * | 1/1997 | Olivo et al. | 365/230.06 |
| 5,719,521 A | * | 2/1998 | Wong | 327/434 |
| 6,657,472 B1 | * | 12/2003 | Raza et al. | 327/217 |
| 2011/0024839 A1 | * | 2/2011 | Zinn et al. | 257/343 |

* cited by examiner

*Primary Examiner* — Lincoln Donovan
*Assistant Examiner* — Patrick Chen
(74) *Attorney, Agent, or Firm* — Gardere Wynne Sewell LLP

(57) ABSTRACT

A driver circuit for driving a power transistor includes a converter having a first transistor and a second transistor coupled in series between a supply node and a reference node. The converter is configured to receive a first signal and in response thereto generate a second signal for selectively controlling status of the power transistor. The ratio of a first leakage current of the first transistor to a second leakage current of the second transistor is used in the generation of the second signal which is applied to the control terminal of a transistor switch that is selectively actuated to turn off the power transistor.

19 Claims, 4 Drawing Sheets

DRIVER CIRCUIT FOR DRIVING POWER TRANSISTORS

PRIORITY CLAIM

This application claims priority from Chinese Application for Patent No. 201210596228.2 filed Dec. 31, 2012, the disclosure of which is incorporated by reference.

TECHNICAL FIELD

This invention relates generally to electronic circuits, and more particularly to a driver circuit for driving power transistors.

BACKGROUND

Power supply voltage is provided through power supply circuits to external loads. Power supply circuits generally have a configuration of a high side power MOS transistor and a low side power MOS transistor coupled in series. The high side power MOS transistor may be coupled between a supply node for receiving a supply voltage and an output node for providing the supply voltage to external loads, and the low side power MOS transistor is coupled between the output node and a reference node for receiving a reference voltage that is lower than the supply voltage. These two power MOS transistors may be turned on or off to selectively deliver the supply voltage to the external loads.

FIG. 1 shows a conventional driver circuit 10 for driving a high side power PMOS transistor 11. As shown in FIG. 1, the high side power PMOS transistor 11 is coupled between a supply node 12 and an output node 13, and a gate of the high side power PMOS transistor 11 is coupled to a control node 14 to receive an operation signal $V_{op}$. Further, a resistor 15 is coupled between the gate of high side power PMOS transistor 11 and the supply node 12. When the operation signal $V_{op}$ is at a low level, the gate-to-source voltage of the high side power PMOS transistor 11 may be higher than its threshold voltage, thereby turning on the high side power PMOS transistor 11. However, the great voltage difference across the resistor 15 may generate a current flowing through the resistor 15, which may adversely affect the inner control circuit of the high side power PMOS transistor 11.

FIG. 2 shows another conventional driver circuit 20 for driving a high side power PMOS transistor 21. As shown in FIG. 2, the high side power PMOS transistor 21 is coupled between a supply node 22 and an output node 23. A gate of the high side power PMOS transistor 21 is coupled to a control node 24 to receive an operation signal $V_{op}$. The driver circuit 20 comprises a current mirror 25 with a PMOS transistor 25a and a PMOS transistor 25b. Specifically, gates of the PMOS transistors 25a and 25b as well as the drain of transistor 25a are coupled to the supply node 22 via a resistor 26. The drain of the PMOS transistor 25a is coupled to receive a bias current from a current source 27 under the control of a switch 28, and a drain of the PMOS transistor 25b is coupled to the gate of the high side power PMOS transistor 21. A mirror current may be generated by the current mirror 25 based on the bias current from the current source 27 and then supplied to the gate of the high side power PMOS transistor 21.

In operation, when the switch 28 is turned on, the bias current may be supplied to the drain of 25a, thereby turning on the PMOS transistor 25b. Thus, the gate of the high side power MOS transistor 21 may be pulled up close to the supply voltage, and then the high side power MOS transistor 21 may be turned off. From the foregoing, a bias current is needed for the driver circuit 20 to turn off the high side power PMOS transistor 21, which significantly increases the shut-down power consumption of the driver circuit 20.

When the switch 28 is turned off, the PMOS transistor 25b is turned off because its gate is elevated to the supply voltage. Therefore, the operation of power transistor 21 is determined by the signal $V_{op}$.

FIG. 3 shows another conventional driver circuit 30 for driving a high side power PMOS transistor 31. As shown in FIG. 3, the high side power PMOS transistor 31 is coupled between a supply node 32 and an output node 33. A gate of the high side power MOS transistor 31 is coupled to a control node 34 to receive an operation signal $V_{op}$. The driver circuit 30 comprises a bipolar transistor 35 coupled between the supply node 32 and the gate of the high side power MOS transistor 31. A resistor 36 is coupled between a base and a collector of the bipolar transistor 35. The base of the bipolar transistor 35 and one end of the resistor 36 are coupled to a current source 37 through a switch 38. In operation, when the switch 38 is turned on to supply a bias current from the current source 37 to the resistor 36, the bipolar transistor 35 is quasi base-collector connected, thereby clamping a gate-to-source voltage of the high side power PMOS transistor 31 lower than a base-to-emitter voltage of the bipolar transistor 35. Thus, the high side power PMOS transistor 31 can be turned off if the bipolar transistor 35 has a lower threshold than the power PMOS transistor 31 in process. However, the manufacturing process of the bipolar transistor 35 may adversely affect the off state of the high side power PMOS transistor 31. Furthermore, the high side power PMOS transistor 31 may work under a sub-threshold state when the high side power PMOS transistor 31 is at a high temperature. Thus, the power consumption of the driver circuit 30 may be significantly increased due to a high leakage current flowing through the high side power PMOS transistor 31.

SUMMARY

Due to the issues stated above, there is a need for a driver circuit for driving a power transistor with lower power consumption and increased process compatibility without affecting any inner control circuit that is coupled to the gate of the power transistor and is configured to control the operation of the power transistor.

In one aspect, a driver circuit for driving a power transistor comprises a converter comprising a first transistor and a second transistor coupled in series between a supply node and a reference node, configured to receive a first signal and in response generate a second signal for selectively controlling status of the power transistor based on a ratio of a first leakage current of the first transistor and a second leakage current of the second transistor.

In one embodiment, the driver circuit further comprises a first switch coupled to a gate of the power transistor and the first switch is controlled by the second signal generated by the converter.

In another embodiment, the first transistor is a PMOS transistor having a first gate configured to receive the first signal, a first source coupled to the supply node and a source of the power transistor, and a first drain; and the second transistor is an NMOS transistor having a second gate and a second source together coupled to the reference node, and a second drain coupled to the first drain of the first transistor at which the second signal is generated.

In one embodiment, the second transistor is an NDMOS and the first leakage current is a drain-to-source leakage current of the first transistor and the second leakage current is a drain-to-substrate leakage current of the second transistor.

In another embodiment, the first transistor has a width-to-length ratio smaller than that of the second transistor.

In one embodiment, the first switch is a PMOS transistor having a third gate configured to receive the second signal, a third source coupled to the supply node and a third drain coupled to the gate of the power transistor.

In another embodiment, the driver circuit further comprises a voltage-clamping module coupled between the third gate and the third source of the first switch.

In another embodiment, the driver circuit further comprises a signal generator coupled to the converter, configured to receive a control signal and generate the first signal in response to the control signal.

In one embodiment, the signal generator comprises a current source, a second switch and a resistor coupled in series, wherein the second switch is coupled in between the current source and the resister, one end of the resistor is coupled with the supply node and one end of current source is coupled with the reference node; and the second switch is controlled by the control signal, and the first signal is outputted at a common node of the second switch and the resistor.

In another embodiment, the second switch is an NMOS transistor having a fourth gate configured to receive the control signal, a fourth drain coupled with the resistor and a fourth source coupled with the current source.

By using the driver circuit in accordance with the foregoing embodiments, leakage current as well as gate-to-source voltage of the power transistor may be significantly reduced, therefore the power transistor can be fully turned off. Compared with the conventional driver circuits for driving power transistors, the driver circuits described herein are more advantageous. In particular, compared with the driver circuit in FIG. 1, there is no current generated by the driver circuits in accordance with embodiments of the present invention affecting the normal operation of the power transistor; compared with the driver circuit in FIG. 2, no bias current is needed in driver circuits in accordance with embodiments of the present invention in order to turn off the power transistor, therefore power consumption is reduced; and compared with the driver circuit in FIG. 3, driver circuits in accordance with embodiments of the present disclosure do not require a separate manufacturing process which may affect the device characteristics of the power transistor.

The foregoing has outlined, rather broadly, features of the present invention. Additional features of the invention will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present invention and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

Figure 4:
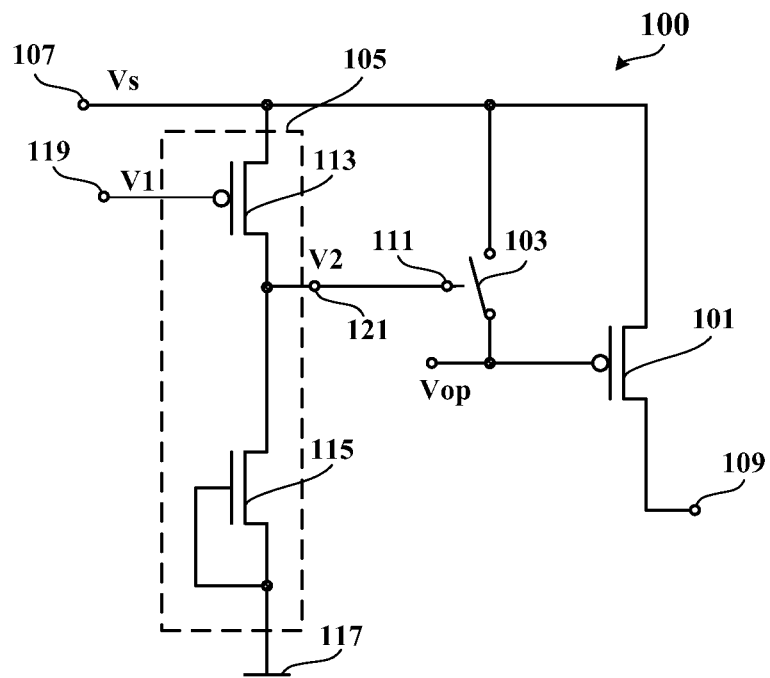
FIG. 4 shows a driver circuit for driving a power transistor in accordance with one embodiment.

FIG. 4 shows a driver circuit 100 for driving a power transistor in accordance with one embodiment. The driver circuit 100 can be used to drive a power transistor 101. In one embodiment, the power transistor 101 may be a high side power transistor, which may be coupled in series with a low side power transistor. The high side power transistor 101 may function as a switch for controlling whether or not a supply voltage could be delivered to an external load. In another embodiment, the power transistor 101 may be a low side power transistor for which a driver circuit may be established by making adaptive modifications understood by one skilled in the art. In practice, the driver circuit 100 can be used in a low drop out regulator, a pulse width modulation circuit or other circuits having one or more power transistors.

As shown in FIG. 4, the driver circuit 100 comprises a switch 103 and a converter 105. The power transistor 101 is coupled between a supply node 107 and an output node 109. The supply node 107 is configured to receive a power supply, such as a battery, to receive a supply voltage $V_s$. The output node 109 is coupled to the external load (not shown) and is configured to selectively provide the supply voltage $V_s$ to the external load. In one embodiment, the power supply is a positive power supply, and the power transistor 101 is a PMOS power transistor, with its source coupled to the supply node 107 and its drain coupled to the output node 109. In another embodiment, the power transistor 101 may be an NMOS power transistor and the other transistors of the driver circuit may be adaptively selected to cooperate with such a power transistor.

The switch 103 may be coupled to a gate of the power transistor 101 to control the status of the power transistor 101. In one embodiment, the switch 103 may be a MOS transistor, for example a PMOS transistor. One end, for example the drain of switch 103 is coupled to the gate of the power transistor 101, and the other end, for example the source of switch 103 is coupled to the supply node 107. The state of the switch 103 is controlled by a signal received at the control node 111, for example the gate of switch 103. In operation, when the switch 103 is turned on, the voltage at the gate of the power transistor 101 will be elevated to the supply voltage $V_s$, thereby turning off the PMOS power transistor 101. When the switch 103 is turned off, the gate of the power transistor 101 will be only controlled by an operation signal $V_{op}$ received at the gate of the PMOS power transistor 101.

In one embodiment, the converter 105 may include a PMOS transistor 113 and a NMOS transistor 115 coupled in series. In one embodiment, the source of the transistor 113 is coupled to the supply node 107, and the gate and the source of the transistor 115 are coupled to a reference node 117 coupled to ground or to receive a voltage that is lower than the supply voltage. The converter 105 is configured to receive a signal $V_1$ at its input node 119, and in response to the signal $V_1$ provide a signal $V_2$ at its output node 121 which is coupled to the control node 111 of the switch 103. The input node 119 of the converter 105 is coupled with the gate of the transistor 113. The output node 121 of the converter 105 is coupled with the drain of the transistor 113 as well as the drain of the transistor 115.

In one embodiment, the transistor 115 may be an NDMOS (n-type double diffused MOS). According to the physical characteristics of DMOS, there may be a considerable drain to substrate leakage current due to the N-well or drift region forming a diode-like structure with the p-type substrate. In one of the embodiment, the magnitude of the drain to substrate leakage current of transistor 115 may be in the order of nano-Amperes. In contrast, the drain to source leakage current of transistor 113 may be much smaller and may be in the order of pico-Amperes, because the drain to source leakage current of the transistor 113 has to cross the n-type region between the drain and source. In one embodiment, the driver circuit 100 may be manufactured using the BCD (Bipolar, CMOS, DMOS) process.

In operation, the signal $V_1$ may be of a first level for turning off the transistor 113. The transistor 115 is always turned off because its gate and source are coupled with each other. Under such a condition, the signal $V_2$ at the output node 121 is determined by the drain to source leakage current of the transistor 113 and the drain to substrate leakage current of the transistor 115. Specifically, as described above, the drain to source leakage current of the transistor 113 is much smaller than the drain to substrate leakage current of the transistor 115, which means that the ratio of the two leakage currents is much smaller than 1, therefore the voltage at the output node 121 may be pulled down to the reference potential such as ground. In that case, the switch 103 can be turned on and the voltage at the gate of the power transistor 101 may be pulled up to about $V_s$ and the power transistor 101 is therefore turned off.

In some embodiments, the leakage current of a MOS transistor significantly depends on the width-to-length ratio thereof, or more specifically, the leakage current is generally in proportion to the width-to-length ratio. Therefore, the width-to-length ratio of the transistor 113 and the width-to-length ratio of the transistor 115 may be adjusted to further guarantee the ratio of the drain to source leakage current of transistor 113 is much smaller than the drain to source leakage current of transistor 115, so that the switch 103 may be turned on and the power transistor 101 may be fully turned off. For example, the width-to-length ratio of the transistor 113 and 115 may be configured as follow:

$$\left(\frac{W}{L}\right)_{103} = \left(\frac{W}{L}\right)_{113} = \frac{6\ \mu m}{1\ \mu m}, \left(\frac{W}{L}\right)_{115} = \frac{50\ \mu m}{1\ \mu m}$$

Furthermore, the signal $V_1$ may be of a second level for turning on the transistor 113. Then the voltage of the signal $V_2$ may be elevated to the supply voltage $V_s$. Therefore, the switch 103 is turned off, and the operation of the power transistor 101 may be solely determined by the signal $V_{op}$.

From the foregoing, when the power transistor 101 is turned off to disconnect the external load from the power supply, the transistor 113 and the transistor 115 of the converter 105 are both turned off, only leakage currents flow through the transistors 113 and 115. Therefore, the driver circuit 100 consumes significantly less electrical power than conventional driver circuits when the power transistor 101 is turned off.

Figure 5:
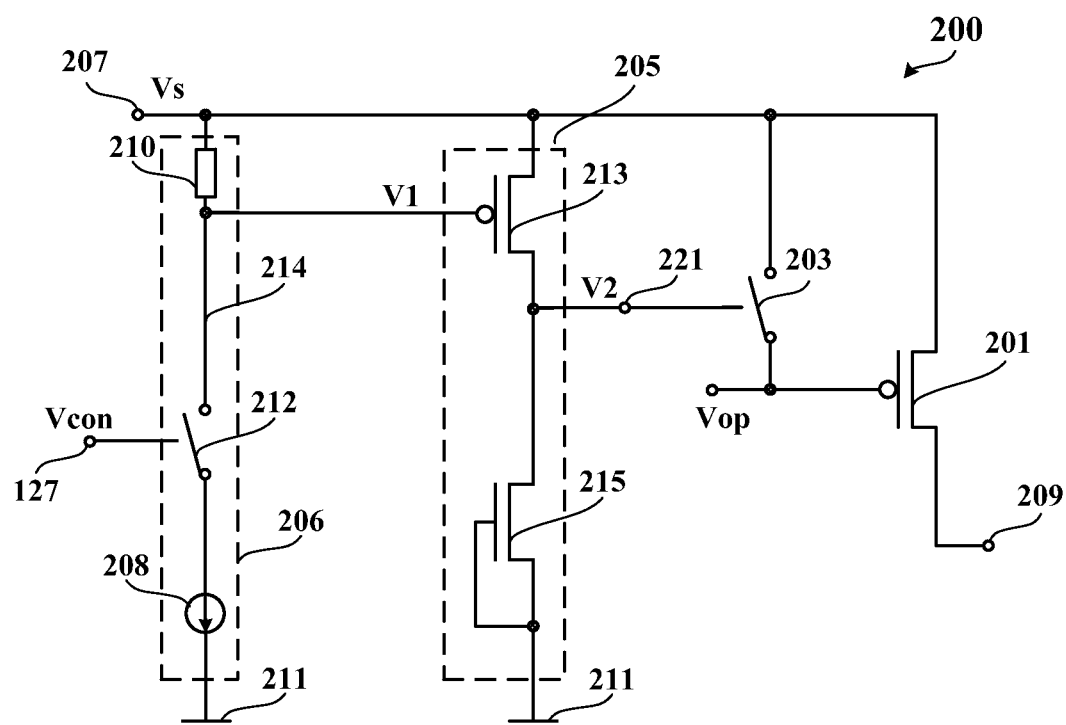
FIG. 5 shows another driver circuit for driving a power transistor in accordance with one embodiment.

FIG. 5 shows a driver circuit 200 for driving a power transistor 201 in accordance with one embodiment. The power transistor 201 may be a high side power transistor, which may be coupled in series with a low side power transistor.

As shown in FIG. 5, the driver circuit 200 comprises a switch 203, a converter 205 and a signal generator 206. The converter 205 comprises a PMOS transistor 213 and an NMOS transistor coupled in series. The configuration and operation of 201, 203, 213 and 215 in FIG. 5 are substantially the same as the configuration and operation of 101, 103, 113 and 115 in FIG. 4 except that the signal $V_1$ at the gate of transistor 213 is generated by the signal generator 206.

The signal generator 206 is configured to receive a control signal $V_{con}$ and generate the signal $V_1$ according to the control signal $V_{con}$. In one embodiment, the signal generator 206 comprises a current source 208 and a resistor 210 coupled in series between the supply node 207 and the reference node 211. Specifically, the resistor 210 is coupled to the supply node 207 and the current source 208 is coupled to the reference node 211. The current source 208 provides a bias current to the resistor 210 to generate a voltage variation across the resistor 210. The signal generator 206 further comprises a switch 212 coupled between the current source 208 and the resistor 210. The switch 212 is configured to receive the control signal $V_{con}$ at its control node and in response to generate the signal $V_1$ at a common node 214 of the switch 212 and the resistor 210. In one embodiment, the switch 212 may be a MOS transistor, for example an NMOS transistor.

In operation, when the switch 212 is turned off by the control signal $V_{con}$, the voltage at the common node 214 is elevated to the supply voltage $V_s$, which turns off the transistor 213. When the switch 212 is turned on by the control signal $V_{con}$, the voltage at the common node 214 is pulled down to a voltage level equal to the supply voltage $V_s$ minus the voltage variation across the resistor 210. The voltage variation across the resistor 210 may be adjusted close to the amplitude of the supply voltage $V_s$ by specifically design of the resistance of the resistor 210 and the bias current, the signal $V_1$ provided at the common node 214 will be close to a low level that turns on the transistor 213. The transistor 215 is always turned off as its gate and source are coupled together. In this way, both the transistor 213 and the transistor 215 are turned off, and therefore the signal $V_2$ for actuating the switch 203 to turn off the power transistor 201 is obtained at the output node 221 of the converter 205 based on the ratio of the drain to source leakage current of the transistor 213 and the drain to substrate leakage current of transistor 215.

It will be readily appreciated by those of ordinary skills in the art that, other type of signal generator may be employed herein to generate the signal $V_1$.

Figure 1:
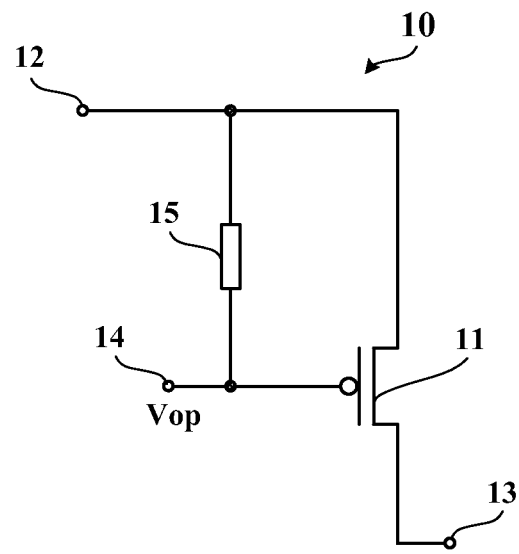
FIG. 1 shows a conventional circuit for driving a high side power MOS transistor.
Figure 2:
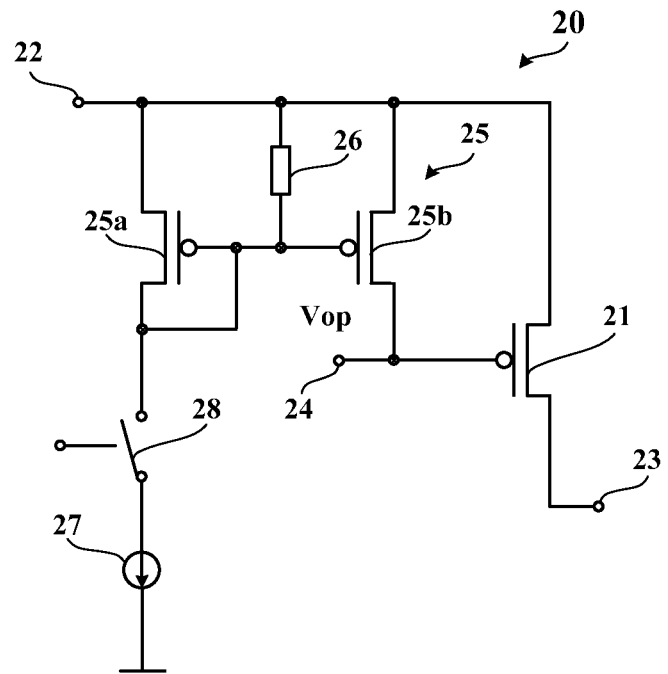
FIG. 2 shows another conventional driver circuit for driving a high side power MOS transistor.
Figure 3:
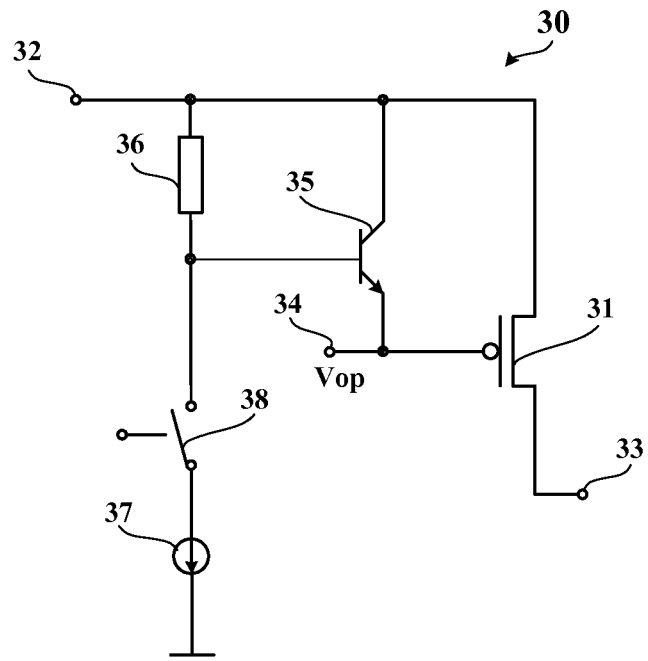
FIG. 3 shows yet another conventional driver circuit for driving a high side power MOS transistor.
Figure 6:
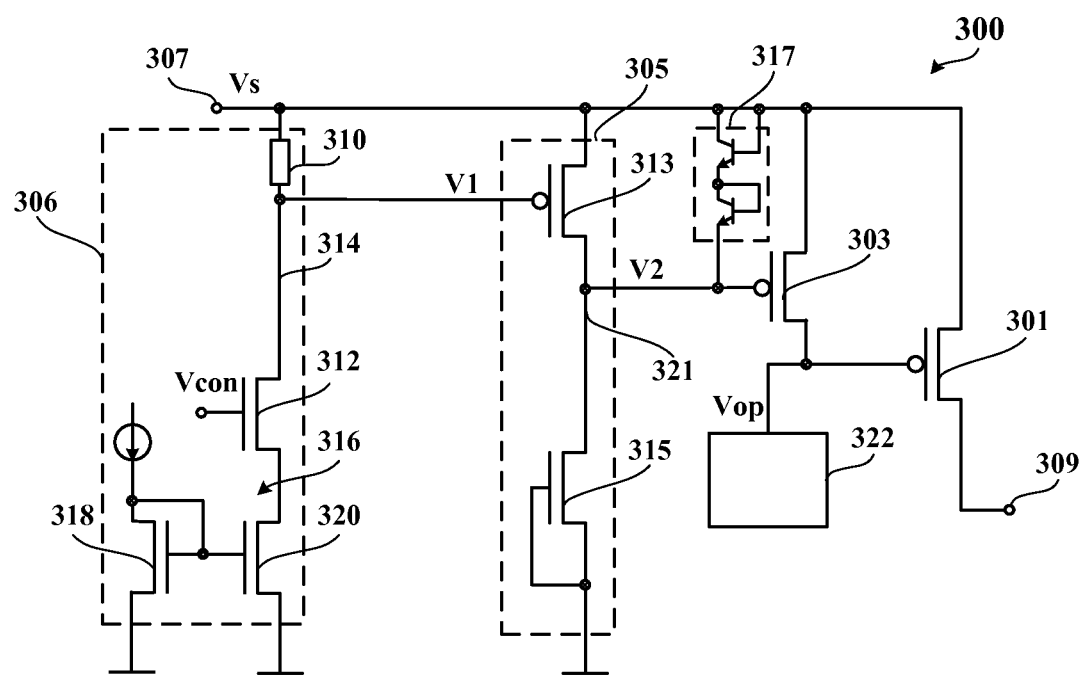
FIG. 6 shows yet another driver circuit for driving a power transistor in accordance with one embodiment.

FIG. 6 shows another driver circuit 300 for driving a power transistor 301 in accordance with another embodiment. As shown in FIG. 6, the driver circuit 300 comprises a switch 303 which may be a PMOS transistor, a converter 305 which comprises a PMOS transistor 313 and an NMOS transistor 315 coupled in series, a signal generator 306 and a voltage clamping module 317. The configuration and operation of 301, 303, 313, and 315 are substantially the same as that of 101, 103, 113 and 115 illustrated in FIG. 1, except that the signal $V_1$ at the gate of the transistor 313 is generated by the signal generator 306 and the gate-to-source voltage of switch 303 is clamped by the voltage clamping module 317.

In one embodiment, the signal generator 306 comprises a resistor 310, an NMOS transistor 312 and a current mirror 316 coupled in series, with one end of the resistor 310 coupled to the supply node 307, one end of the current mirror 316 coupled with the reference node and the NMOS transistor 312 coupled between the resistor 310 and the current mirror 316. The current mirror 316 includes a pair of NMOS transistors 318 and 320 whose gates are coupled to each other. The transistor 318 receives a reference current at its drain and gate, and the transistor 320 provides a bias current in proportion to the reference current according to the width-length ratio of the transistors of the current mirror 316. The bias current is then provided to the resistor 310 to generate a voltage variation across the resistor 310 according to the state of the NMOS transistor 312.

In operation, when the NMOS transistor 312 is turned on by a control signal $V_{con}$ received at the gate of the NMOS transistor 312, the bias current will generate a voltage variation across the resistor 310. Therefore, the voltage $V_1$ at a common node 314 of the resistor 310 and the NMOS transistor 312 may be pulled down to a low voltage level by specifically configuring the resistor 310 and the bias current, which may turn on the transistor 313 in the converter 321. Alternatively, when the NMOS transistor 312 is turned off by the control signal $V_{con}$, the voltage $V_1$ at the common node 314 of the resistor 310 and the NMOS transistor 312 may be elevated to the supply voltage $V_s$, which further turns off the transistor 313. In this case, the status of transistor 303 may be determined based on the ratio of the drain to source leakage current of transistor 313 and the drain to substrate leakage current of transistor 315.

In one embodiment, the driver circuit 300 further comprises a voltage clamping module 317, which is coupled between the supply node 307 and the gate of switch 303. The clamping module 317 is configured to clamp a voltage difference between the supply node 307 and the gate of switch 303 to be below a predetermined level. Such configuration is to protect the PMOS transistor 303 when an accidental peak value of the supply voltage $V_s$ occurs. In some embodiments, the voltage clamping module 317 comprises one or more Zener diodes coupled in series. In some other embodiments, the clamping module 317 comprises one or more diode-connected bipolar transistors or MOS transistors coupled in series.

In some embodiments, both of the NMOS transistor 315 and the NMOS transistor 312 may be DMOS transistors. Because the drift region of the DMOS transistor can sustain a great voltage drop, the NMOS transistor 315 and the NMOS transistor 312 can be used to separate a high voltage portion of the driver circuit 300 from a low voltage portion of the driver circuit 300.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A driver circuit for controlling turn-off of a power transistor, comprising:
    a converter comprising a first transistor and a second transistor coupled in series between a supply node and a reference node, wherein the converter is configured to receive a first signal and in response thereto generate a second signal for selectively controlling turn-off status of the power transistor,
    wherein the first transistor is configured to have a first leakage current when set in the off state in response to said first signal;
    wherein the second transistor is permanently set in the off state regardless of said first signal and is configured to have a second leakage current in the permanent off state; and
    wherein the first leakage current of the first transistor is less than the second leakage current of the second transistor; and wherein the first transistor has a width-to-length ratio smaller than that of the second transistor.

2. The driver circuit of claim 1, further comprising a first switch coupled to a gate of the power transistor; wherein the first switch is controlled by the second signal generated by the converter.

3. The driver circuit of claim 2, wherein the first switch is a PMOS transistor having a gate configured to receive the second signal, a source coupled to the supply node and a drain coupled to the gate of the power transistor.

4. The driver circuit of claim 1, wherein the first transistor is a PMOS transistor having a gate configured to receive the first signal, a source coupled to the supply node and a source of the power transistor, and a drain; and the second transistor is an NMOS transistor having a gate and a source connected together and coupled to the reference node, and a drain coupled to the drain of the first transistor at which the second signal is generated.

5. The driver circuit of claim 4, wherein the second transistor is an NDMOS transistor and the first leakage current is a drain-to-source leakage current of the first transistor and the second leakage current is a drain-to-substrate leakage current of the second transistor.

6. The driver circuit of claim 1, further comprising a voltage clamping module coupled between an output node where the second signal is generated and the supply node.

7. The driver circuit of claim 1, further comprising a signal generator coupled to an input node of the converter, said signal generator configured to receive a control signal and generate the first signal in response to the control signal, said first signal applied to the input node.

8. The driver circuit of claim 7, wherein the signal generator comprises:
    a current source, a second switch and a resistor coupled in series;
    wherein the second switch is coupled in between the current source and the resister;
    wherein one end of the resistor is coupled with the supply node and one end of current source is coupled with the reference node; and
    wherein the second switch is controlled by the control signal, and the first signal is outputted at a common node of the second switch and the resistor.

9. The driver circuit of claim 8, wherein the second switch is an NMOS transistor having a gate configured to receive the control signal, a drain coupled with the resistor and a source coupled with the current source.

10. The driver circuit of claim 1, wherein a magnitude of the first leakage current of the first transistor is less than a magnitude of the second leakage current of the second transistor by at about three orders of magnitude.

11. A driver circuit for controlling turn-off of a power transistor, comprising:
a switch coupled between a first reference supply node and a gate of the power transistor;
a first transistor coupled between the first reference supply node and a control terminal of said switch and having a control terminal receiving a control signal;
a second transistor coupled between the control terminal of said switch and a second reference supply node; and
wherein a control terminal of the second transistor is coupled to place the second transistor in a permanently off operational state, and where a leakage current of the permanently off second transistor exceeds the leakage current of the first transistor and is sufficient to cause a turn on of said switch when said control signal has a state configured to turn off the first transistor.

12. The driver circuit of claim 11, wherein the leakage current of the first transistor is a drain-to-source leakage current and the leakage current of the second transistor is a drain-to-substrate leakage.

13. The driver circuit of claim 11, wherein the second transistor is a DMOS transistor.

14. The driver circuit of claim 11, wherein the second transistor is an NMOS transistor having a gate and a source connected together and to the second reference supply node.

15. A driver circuit for controlling turn-off of a power transistor, comprising:
a first transistor coupled between a first reference supply node and a gate of the power transistor;
a second transistor coupled between the first reference supply node and a control terminal of said first transistor and having a control terminal receiving a control signal;
a third transistor coupled between the control terminal of said first transistor and a second reference supply node, said third transistor configured in a permanently off operational state; and
wherein the third transistor is further configured to have a leakage current in the permanently off operational state which is sufficient to cause a turn on of the first transistor when said control signal has a state that is configured to turn off the second transistor.

16. The driver circuit of claim 15, wherein the third transistor is an NMOS transistor having a gate and a source connected together and to the second reference supply node.

17. The driver circuit of claim 16, wherein the first and second transistors are PMOS transistors.

18. The driver circuit of claim 16, wherein the third transistor is an NDMOS transistor.

19. The driver circuit of claim 15, wherein the leakage current of the third transistor in the permanently off operational state exceed a leakage current of the second transistor when said control signal has a state that is configured to turn off the second transistor.

* * * * *